United States Patent [19]

Kröner

[11] Patent Number: 4,518,933
[45] Date of Patent: May 21, 1985

[54] INTEGRABLE TRANSISTOR OSCILLATOR REQUIRING ONLY ONE PIN TO QUARTZ RESONATOR

[75] Inventor: Klaus Kröner, Hamburg, Fed. Rep. of Germany

[73] Assignee: U.S. Philips Corporation, New York, N.Y.

[21] Appl. No.: 345,995

[22] Filed: Feb. 5, 1982

[30] Foreign Application Priority Data

Feb. 11, 1981 [DE] Fed. Rep. of Germany ....... 3104849

[51] Int. Cl.$^3$ .................. H03B 5/30; H03K 3/281
[52] U.S. Cl. .................... 331/108 D; 331/113 R; 331/116 R; 331/117 FE
[58] Field of Search .......... 331/116 R, 108 D, 113 R, 331/117 FE

[56] References Cited

U.S. PATENT DOCUMENTS

| 3,730,989 | 5/1973 | Rhee | 331/117 R X |
| 3,824,491 | 7/1974 | Treadway | 331/116 R X |
| 3,911,373 | 7/1975 | Ohtake et al. | 331/113 R X |

FOREIGN PATENT DOCUMENTS 1389203  4/1975  United Kingdom ............ 331/116 R

OTHER PUBLICATIONS

Sinclair, I. R. "Square Wave Generator", *Radio and Electronics Constructor*, vol. 30 #12, Jul. 1977, pp. 736–738.
Luckav, H. et al. "Integrated Quartz Oscillator QO52", *Components Report*, vol. #5, Nov. 1976, pp. 162–166.
Tesic, S. et al., "A Quartz Multivibrator Using Two Regenerative Switches", *Proceedings of the IEEE*, Jan. 1977, pp. 166–167.

*Primary Examiner*—Eugene R. Laroche
*Assistant Examiner*—D. Mis
*Attorney, Agent, or Firm*—Thomas A. Briody; William J. Streeter; Edward W. Goodman

[57] ABSTRACT

The invention relates to a quartz oscillator comprising two transistors to whose base terminals the collector voltage of each one of the other transistors is applied, a two-terminal network incorporating a quartz resonator being connected to the emitter of one of the transistors. The collector voltage is applied to the corresponding base via a semiconductor junction. The oscillator further includes respective emitter and collector impedances for the transistors in which the product of the emitter impedances is greater than the product of the collector impedances. When the supply voltage is sufficiently low so that the collector-base diodes of the transistors are always in the non-conducting state, the oscillator frequency is independent, to a very large degree, of saturation phenomena of the two transistors. When manufactured in integrated circuit form, only one additional exterior terminal is required for the connection of a quartz resonator.

4 Claims, 1 Drawing Figure

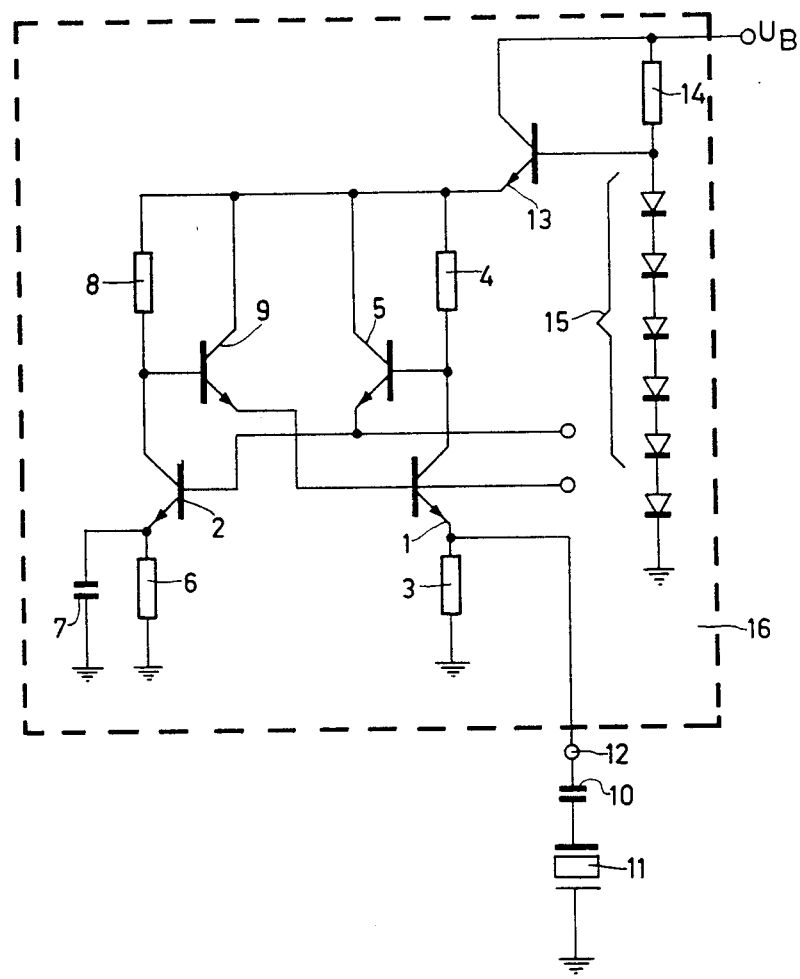

INTEGRABLE TRANSISTOR OSCILLATOR REQUIRING ONLY ONE PIN TO QUARTZ RESONATOR

BACKGROUND OF THE INVENTION

The invention relates to a quartz oscillator comprising two transistors whose collectors are connected each one via a collector impedance to a pole of a direct voltage source and each one via at least one semiconductor junction to the base of the other transistor, a two-terminal network comprising a quartz resonator being connected to the emitter of one transistor.

Such a quartz oscillator is disclosed in U.S. Pat. No. 3,824,491, in which the emitters of the two transistors are connected each one via a direct current source to ground and interconnected via the two-terminal network incorporating the quartz oscillator. All the transistors are of the same conductivity type, so that basically the circuit can be manufactured in integrated circuit form. However, two terminals are required to connect the two-terminal network to the quartz.

In addition, the periodical "Funkschau" 1980, volume 20 discloses a quartz oscillator comprising two transistors of the opposite conductivity type which each have a collector and an emitter impedance and whose base terminals are directly connected to the collector branch of the other transistor, the two-terminal network incorporating the resonator being arranged in parallel with an emitter resistor. However, as the transistors are of the opposite conductivity type, this circuit can hardly be manufactured in integrated circuit form. Furthermore there is the risk that the collector-base diode of at least one of the transistors becomes conductive and that this transistor becomes saturated. The reduction of the charge carrier connected thereto in the transistor results however in delays which cause that, at least at frequencies of 5 MHz and higher, the oscillator frequency is no longer determined by the quartz crystal alone.

SUMMARY OF THE INVENTION

It is an object of the present invention to provide a circuit in which transistors of the same conductivity type can be used and whose active and passive elements—the two-terminal network comprising the quartz resonator excepted—can be manufactured in integrated circuit form, only one additional exterior terminal being required for the connection of the two-terminal network and the oscillator frequency being unaffected to a very large extent by saturation phenomena. Starting from a quartz oscillator of the type described in the opening paragraph, this object is accomplished in that the emitters of the first and second transistors are each connected to the other pole of the direct voltage source via an emitter impedance which is conductive for direct current, the product of the emitter impedances being greater than the product of the collector impedances, that the two-terminal network is arranged in parallel with the emitter impedance of one transistor and that the supply voltage has been chosen so low that the collector-base diodes of the first and second transistors are always in the non-conducting state.

The loop gain is, at all frequencies, the load resonant frequency excepted, below unity, while it is essentially only determined by the collector and emitter impedances. Because of the fact that the two-terminal network is arranged in parallel with the emitter impedance of one transistor, its gain is decreased to such an extent at the load resonant frequency that the loop gain, which corresponds to the product of the gains of the two transistors, becomes greater than 1 for this frequency. Consequently, the oscillator circuit oscillates at the load resonant frequency. When the supply voltage is chosen low enough, it is ensured that the collector-base diode of each transistor of the circuit remains non-conductive in every phase of the oscillation.

A further embodiment of the invention provides that the ratio between the collector impedance and the emitter impedance is the same for both transistors and that the collector electrodes of the two transistors are each coupled via the same number of semiconductor junctions to the base of the other transistor, the semi-conductor junctions preferably being in the form of emitter followers. This further embodiment results in the same direct voltages being produced at the outputs of the emitter followers, so that a circuit arrangement (not shown) requiring an oscillator having complementary symmetrical outputs may be driven therewith.

DESCRIPTION OF THE DRAWING

The invention will now be further described by way of example with reference to the accompanying drawing in which the sole FIGURE shows a circuit incorporating the invention.

DESCRIPTION OF THE PREFERRED EMBODIMENT

The circuit comprises a transistor 1, whose emitter is connected to ground via a 1 kOhm resistor 3. The collector thereof is connected to a positive supply voltage via a 500 Ohm resistor 4 and furthermore to the base of a transistor 5, whose emitter is connected to the base of a transistor 2 and whose collector is also connected to the positive supply voltage.

The emitter of the transistor 2 is connected to ground via a resistor 6 also have a value of 1 kOhm, a 2 pF capacitor 7, which has for its function to prevent a decrease in the loop gain at frequencies in the region of the oscillator frequency, being arranged in parallel with this resistor. When the decrease in the gain of the transistors at the oscillator frequency is very small, this capacitor may be omitted. The collector of the transistor 2 is connected to the positive supply voltage via a resistor 8 having also a value of 500 Ohm and is connected to the base of a transistor 9 whose emitter is connected to the base of the transistor 1 and whose collector is also connected to the positive supply voltage. All transistors are of the same conductivity type (npn).

The positive supply voltage is supplied by the emitter of a transistor 13, which is connected as an emitter follower, the collector of this transistor being connected to a still more positive direct voltage potential $U_B$, for example $+10$ V, and via a resistor 14 to a bias voltage generator 15 consisting of six diodes which are connected in the forward direction and arranged in series; the diodes may each be in the form of a transistor whose base is connected to its collector. The potential at the junction point of the resistors 14 and the bias voltage generator 15, to which the base of the transistor 13 is connected, is six times the base-emitter voltage $u_{be}$ of a transistor connected in the forward direction. The potential at the emitter of the transistor 13 is lower by the amount of the base-emitter bias voltage of this transistor, that is to say the supply voltage of the oscillator circuit is five times the base-emitter voltage of a transistor, so between 3 and 4 V.

At the above-mentioned voltage ratios, the collector direct voltages of the transistors 1 and 2 is 4 $u_{be}$ and the emitter potential of the emitter follower 5 and 9—and consequently also the base potential of the transistors 1 and 2—is 3 $u_{be}$. Arranged in series with the emitter resistor 3 of the transistor 1 is a two-terminal network formed by the series arrangement of a 22 pF capacitor 10 and a quartz oscillator 11 of 13.8 MHz. One terminal of the two-terminal network is connected to ground and the other terminal to a terminal 12, which is directly connected to the emitter of the transistor 1.

At all frequencies, the load resonant frequency of the quartz resonator excepted, the gains of the two transistors 1 and 2 (the gains of the emitter followers 5, 9 are 1) depend almost exclusively on the emitter-resistors 3, 6 and the collector-resistors 4, 8. At the above-mentioned ratios, the gains are both approximately 0.5, so that a loop gain of 0.25 is obtained, which means that the circuit cannot oscillate at these frequencies. However, at the load resonant frequency the two-terminal network 10, 11 forms an impedance which is essentially lower than the emitter-resistor 3 of the transistor 1, so that its gain at this frequency is appreciably higher. When the series resistance of the quartz resonator 11 is sufficiently low (100 Ohm or less in the described example), the loop gain becomes greater than 1, so that the circuit oscillates at the load resonant frequency. The oscillating voltage can be taken off between the emitters of the transistors 5 and 9, which are connected as emitter followers.

The seat amplitude of the oscillation at the collector of the transistor 1 does not become higher than the direct voltage drop across the resistor 4, which, at the specified value of the supply voltage, is equal to the base-emitter voltage of a transistor. At the instant of the oscillation which is critical as regards saturation, when namely the collector potential of transistor 1 has its lowest value (3 $u_{be}$), the collector potential of the transistor (2) is 4.5 $u_{be}$ and the base potential of the transistor (1) is 3.5 $u_{be}$, so that the base potential is only half the base-emitter bias voltage more positive than the collector potential, which is not sufficient to render the collector-base diode of the transistor conductive and to drive the transistor to saturation. So the oscillator frequency is not affected by saturation phenomena.

In principle, the collector of each of the two transistors 1, 2 may be connected to the base of the other transistor via a serial arrangement of more than one emitter follower. This indeed increases the cost, but higher supply voltages and consequently higher oscillator amplitudes are then possible, without the risk that one of the two transistors 1, 2 is driven to saturation. It is desirable, but not necessary, for the ratio between the collector resistors 4, 8 and the emitter resistors 3, 6 for both transistors 1, 2 to be equal and to correspond to 0.5. It is, however, important that these resistors are rated such that (the two-terminal network 10, 11 being isolated) the loop gain is always below unity.

When the gains of the two transistors 1 and 2 are chosen equal and when the collectors are connected to the base of the other transistor via the same number of emitter followers, the collector-base diodes of the transistors 1 and 2, respectively are prevented from becoming conductive, when the following equation holds:

$$m < (n+1) \cdot (k+1).$$

Therein k is the quotient of the emitter resistor divided by the collector resistor of a transistor, i.e. the ratio between, for example, the resistor 3 and the resistor 4, n is the number of emitter followers via which the collector of a transistor is coupled to the base of the other transistor and m is a number indicating the number of multiples of the base-emitter voltage of a transistor the supply voltage of the oscillator circuit is higher than this base-emitter voltage. This is based on the assumption that the base-emitter voltages of all the transistors of the oscillator circuit are equal and that the collector-base path of a transistor becomes conductive when the base potential is more positive by the amount of the base-emitter voltage than the collector potential (in the case of npn-transistors). If the collector-base path already becomes conductive at lower values, then the supply voltages must still be lower. In the opposite case the supply voltage may be higher.

As shown by the broken-line block 16, the oscillator circuit may be manufactured in integrated circuit form. Only one additional exterior terminal 12 is required for the connection of the two-terminal network to the quartz resonator 11.

In the embodiment, the base-emitter path of a transistor is used as the semiconductor junction. Instead thereof it is, however, possible to use a different (p-n or n-p-) semiconductor junction, for example, a semiconductor diode.

What is claimed is:

1. A quartz oscillator comprising first and second transistors whose collectors are connected via respective serial collector impedances to a pole of a direct voltage source and are coupled via respective semiconductor junctions to the base of the other transistor, a two-pole network comprising a quartz resonator being connected to the emitter of the first transistor; said quartz oscillator being characterized in that the emitters of the first and second transistors are each connected to the other pole of the direct voltage source via respective emitter impedances which are conductive to direct current, the product of the emitter impedances being greater than the product of the collector impedances, that the two-pole network is arranged in parallel with the emitter impedance of the first transistor and that a supply voltage of the direct voltage source has been chosen so low that the collector-base diodes of the first and second transistors are always in the non-conducting state.

2. A quartz oscillator as claimed in claim 1, characterized in that the ratios between the collector impedance and the emitter impedance for the first and second transistors are equal to each other and that the collector electrodes of the first and second transistors are coupled to the bases of the second and first transistors, respectively, via the same number of semiconductor junctions.

3. A quartz oscillator as claimed in claim 2, characterized in that the emitter impedances are twice as high as the collector impedances, respectively, that the semiconductor junctions are emitter followers and that the supply voltage is five times larger than the base-emitter bias voltage of a conducting transistor.

4. A quartz oscillator as claimed in claim 3, characterized in that the supply voltage is produced by an emitter follower whose base receives the voltage across six diodes which are arranged in series in the same forward direction and to which is applied a direct current flowing in the forward direction.

* * * * *